United States Patent
Zhang

(10) Patent No.: US 9,761,448 B2
(45) Date of Patent: Sep. 12, 2017

(54) METHOD FOR MANUFACTURING LTPS TFT SUBSTRATE STRUCTURE AND STRUCTURE OF LTPS TFT SUBSTRATE

(71) Applicant: Shenzhen China Star Optoelectronics Technology Co., Ltd., Shenzhen (CN)

(72) Inventor: Liangfen Zhang, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 123 days.

(21) Appl. No.: 14/787,768

(22) PCT Filed: Jul. 23, 2015

(86) PCT No.: PCT/CN2015/084868
§ 371 (c)(1),
(2) Date: Oct. 29, 2015

(87) PCT Pub. No.: WO2016/206151
PCT Pub. Date: Dec. 29, 2016

(65) Prior Publication Data
US 2017/0162610 A1   Jun. 8, 2017

(30) Foreign Application Priority Data
Jun. 24, 2015   (CN) .......................... 2015 1 0355056

(51) Int. Cl.
H01L 21/02   (2006.01)
H01L 27/12   (2006.01)

(52) U.S. Cl.
CPC .... H01L 21/02667 (2013.01); H01L 21/0262 (2013.01); H01L 21/02532 (2013.01);
(Continued)

(58) Field of Classification Search
CPC ............. H01L 27/1274; H01L 27/1281; H01L 21/02532; H01L 21/02592;
(Continued)

(56) References Cited

U.S. PATENT DOCUMENTS 6,524,877 B1 * 2/2003 Nakazawa .......... H01L 27/1281
257/40
2014/0367078 A1 * 12/2014 Burger .................. B29C 55/005
165/185

* cited by examiner

*Primary Examiner* — Fei Fei Yeung Lopez
(74) *Attorney, Agent, or Firm* — Leong C. Lei

(57) ABSTRACT

The present invention provides a method for manufacturing an LTPS TFT substrate structure and a structure of an LTPS TFT substrate. The method for manufacturing the LTPS TFT substrate structure according to the present invention provides patterns of a thermally conductive electrical-insulation layer that are of the same size and regularly distributed under a buffer layer of a driving TFT area to absorb heat in a subsequent excimer laser annealing process so as to speed up the cooling rate of amorphous silicon to form crystal nuclei that gradually grow up in the annealing process. Since the thermally conductive electrical-insulation layer is made up of regularly distributed and size-consistent patterns, crystal grains of a polycrystalline silicon layer located in the driving TFT area show improved consistency and homogeneity and the grain sizes are relatively large to ensure the consistency of electrical property of the driving TFT. The structure of the LTPS TFT substrate structure according to the present invention includes patterns of a thermally conductive electrical-insulation layer that are regularly distributed under a buffer layer of a driving TFT area and have the same size, so that crystal grains of a polycrystalline silicon layer located in the driving TFT area show improved consistency and homogeneity and the grain sizes are relatively large and thus, the electrical property of the driving TFT is consistent.

11 Claims, 3 Drawing Sheets

(52) U.S. Cl.
CPC .. *H01L 21/02592* (2013.01); *H01L 21/02672* (2013.01); *H01L 21/02675* (2013.01); *H01L 27/1262* (2013.01); *H01L 27/1274* (2013.01); *H01L 27/1281* (2013.01); *H01L 27/1285* (2013.01)

(58) Field of Classification Search
CPC ......... H01L 21/02667; H01L 21/02672; H01L 21/02675
See application file for complete search history.

METHOD FOR MANUFACTURING LTPS TFT SUBSTRATE STRUCTURE AND STRUCTURE OF LTPS TFT SUBSTRATE

BACKGROUND OF THE INVENTION

1. Field of the Invention

The present invention relates to the field of display technology, and in particular to a method for manufacturing a low-temperature polycrystalline silicon (LTPS) thin-film-transistor (TFT) substrate structure and a structure of a LTPS TFT substrate.

2. The Related Arts

LTPS TFT has valuable and potential uses in the field of high definition display devices of active matrix liquid crystal display (AMLCD) and active matrix organic light emitting diode (AMOLCD).

Compared to the amorphous silicon (a-Si) technology, LTPS TFT has a relatively high mobility and excellent device stability. The mobility of LTPS TFT may be as high as tens to hundreds $cm^2/Vs$, which satisfy the needs of high-definition AMLCD and AMOLED displays. Thus, a LTPS display has a faster response speed and shows various advantages including high brightness, high resolution, and low power consumption. In addition to being used as a pixel switch, LPTS TFT is also used to construct a peripheral driver circuit to provide an integrated system on a chip.

Excimer laser annealing (ELA) is a technique of irradiating short period pulses of laser to a surface of amorphous silicon to have it melt and recrystallize. Driving an AMOLED needs a switch TFT and a driving TFT, of which the driving TFT must have consistent electrical property in order to provide a consistent power of driving for preventing inhomogeneity of color displayed in a displaying process. This requires the crystal grains of polycrystalline silicon in an area associated with the driving TFT must show improved homogeneity and the size of the crystal grains must be larger.

However, the state-of-the-art ELA crystallization techniques do not provide an effective control of grain homogeneity and grain size. Consequently, the crystallization shows poor distribution over the entire substrate, leading to poor consistency of polycrystalline silicon grains in the area associated with the driving TFT and relatively small grain sizes, making the consistency and stability of electrical property of the driving TFT. As such, poor image quality may readily occur.

SUMMARY OF THE INVENTION

An object of the present invention is to provide a method for manufacturing a low-temperature polycrystalline silicon (LTPS) thin-film transistor (TFT) substrate structure, which provides improved consistency of grain sizes of polycrystalline silicon in a driving TFT area and makes the grain sizes relatively large to ensure consistency of electrical property of the driving TFT.

Another object of the present invention is to provide a structure of a LTPS TFT substrate, which has improved consistency of grain sizes of polycrystalline silicon in a driving TFT area and makes the grain sizes relatively large to ensure consistency of electrical property of the driving TFT.

To achieve the above objects, the present invention provides a method for manufacturing an LTPS TFT substrate structure, which comprises the following steps:

(1) providing a substrate, wherein the substrate comprises a switch TFT area and a driving TFT area, depositing a thermally conductive electrical-insulation film on the substrate, and patterning the thermally conductive electrical-insulation film to form a thermally conductive electrical-insulation layer located in the driving TFT area;

(2) depositing a buffer layer on the substrate in such a way that the buffer layer covers the thermally conductive electrical-insulation layer;

(3) depositing an amorphous silicon layer on the buffer layer and patterning the amorphous silicon layer to form a first amorphous silicon section that is located in the switch TFT area and a second amorphous silicon section that is located in the driving TFT area;

(4) subjecting the first amorphous silicon section and the second amorphous silicon section to excimer laser annealing (ELA) in order to have the first amorphous silicon section and the second amorphous silicon section crystallize and respectively transform into a first polycrystalline silicon section and a second polycrystalline silicon section;

(5) depositing an interlayer insulation layer on the buffer layer in such a way that the interlayer insulation layer covers the first polycrystalline silicon section and the second polycrystalline silicon section; and (6) depositing a metal layer on the interlayer insulation layer and patterning the metal layer to form a first gate terminal and a second gate terminal respectively at locations above and corresponding to the first polycrystalline silicon section and the second polycrystalline silicon section.

The substrate comprises a glass substrate or a silicon substrate.

The thermally conductive electrical-insulation layer is formed of a material of magnesium oxide or aluminum oxide.

The thermally conductive electrical-insulation layer comprises patterns that are uniformly distributed circles or rectangles having the same size.

In step (2), chemical vapor deposition is applied to form the buffer layer.

The buffer layer is formed of a material of silicon oxide, silicon nitride, or a combination thereof.

In step (3), vapor deposition is applied to form the amorphous silicon layer.

In step (4), a furnace tube, ELA equipment, or a chemical vapor deposition heating chamber is used to subject the first amorphous silicon section and the second amorphous silicon section to ELA.

The present invention also provides a method for manufacturing an LTPS TFT substrate structure, which comprises the following steps:

(1) providing a substrate, wherein the substrate comprises a switch TFT area and a driving TFT area, depositing a thermally conductive electrical-insulation film on the substrate, and patterning the thermally conductive electrical-insulation film to form a thermally conductive electrical-insulation layer located in the driving TFT area;

(2) depositing a buffer layer on the substrate in such a way that the buffer layer covers the thermally conductive electrical-insulation layer;

(3) depositing an amorphous silicon layer on the buffer layer and patterning the amorphous silicon layer to form a first amorphous silicon section that is located in the switch TFT area and a second amorphous silicon section that is located in the driving TFT area;

(4) subjecting the first amorphous silicon section and the second amorphous silicon section to excimer laser annealing (ELA) in order to have the first amorphous silicon section and the second amorphous silicon section crystallize and respectively transform into a first polycrystalline silicon section and a second polycrystalline silicon section;

(5) depositing an interlayer insulation layer on the buffer layer in such a way that the interlayer insulation layer covers the first polycrystalline silicon section and the second polycrystalline silicon section; and (6) depositing a metal layer on the interlayer insulation layer and patterning the metal layer to form a first gate terminal and a second gate terminal respectively at locations above and corresponding to the first polycrystalline silicon section and the second polycrystalline silicon section;

wherein the substrate comprises a glass substrate or a silicon substrate;

wherein the thermally conductive electrical-insulation layer is formed of a material of magnesium oxide or aluminum oxide; and wherein the thermally conductive electrical-insulation layer comprises patterns that are uniformly distributed circles or rectangles having the same size.

The present invention further provides an LTPS TFT substrate structure, which comprises a switch TFT area and a driving TFT area;

the switch TFT area comprising a substrate, a buffer layer arranged on the substrate, a first polycrystalline silicon section arranged on the buffer layer, an interlayer insulation layer arranged on the buffer layer and covering the first polycrystalline silicon section, and a first gate terminal arranged on the interlayer insulation layer and located above and corresponding to the first polycrystalline silicon section; and the driving TFT area comprising a substrate, a thermally conductive electrical-insulation layer arranged on the substrate, a buffer layer arranged on the substrate and covering the thermally conductive electrical-insulation layer, a second polycrystalline silicon section arranged on the buffer layer, an interlayer insulation layer arranged on the buffer layer and covering the second polycrystalline silicon section, and a second gate terminal arranged on the interlayer insulation layer and located above and corresponding to the second polycrystalline silicon section.

The substrate comprises a glass substrate or a silicon substrate. The thermally conductive electrical-insulation layer is formed of a material of magnesium oxide or aluminum oxide. The thermally conductive electrical-insulation layer comprises patterns that are uniformly distributed circles or rectangles. The buffer layer is formed of a material of silicon oxide, silicon nitride, or a combination thereof.

The efficacy of the present invention is that the present invention provides a method for manufacturing an LTPS TFT substrate structure, wherein patterns of a thermally conductive electrical-insulation layer that are of the same size are regularly distributed under a buffer layer of a driving TFT area so that in a subsequent crystallization process of an amorphous silicon layer resulting from ELA treatment, the thermally conductive electrical-insulation layer would absorb heat to speed up the cooling rate of the amorphous silicon to form crystal nuclei that gradually grow up during the annealing process. Since the thermally conductive electrical-insulation layer is made up of regularly distributed and size-consistent patterns, crystal grains of a polycrystalline silicon layer located in the driving TFT area show improved consistency and homogeneity and the grain sizes are relatively large to ensure the consistency of electrical property of the driving TFT, enhancing stability of electrical property of the driving TFT and preventing the events of poor image quality. The present invention provides an LTPS TFT substrate structure, wherein patterns of a thermally conductive electrical-insulation layer that are regularly distributed and have the same size are arranged under a buffer layer of a driving TFT area, so that crystal grains of a polycrystalline silicon layer located in the driving TFT area show improved consistency and homogeneity and the grain sizes are relatively large and thus, the electrical property of the driving TFT is consistent and electrical stability is improved.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
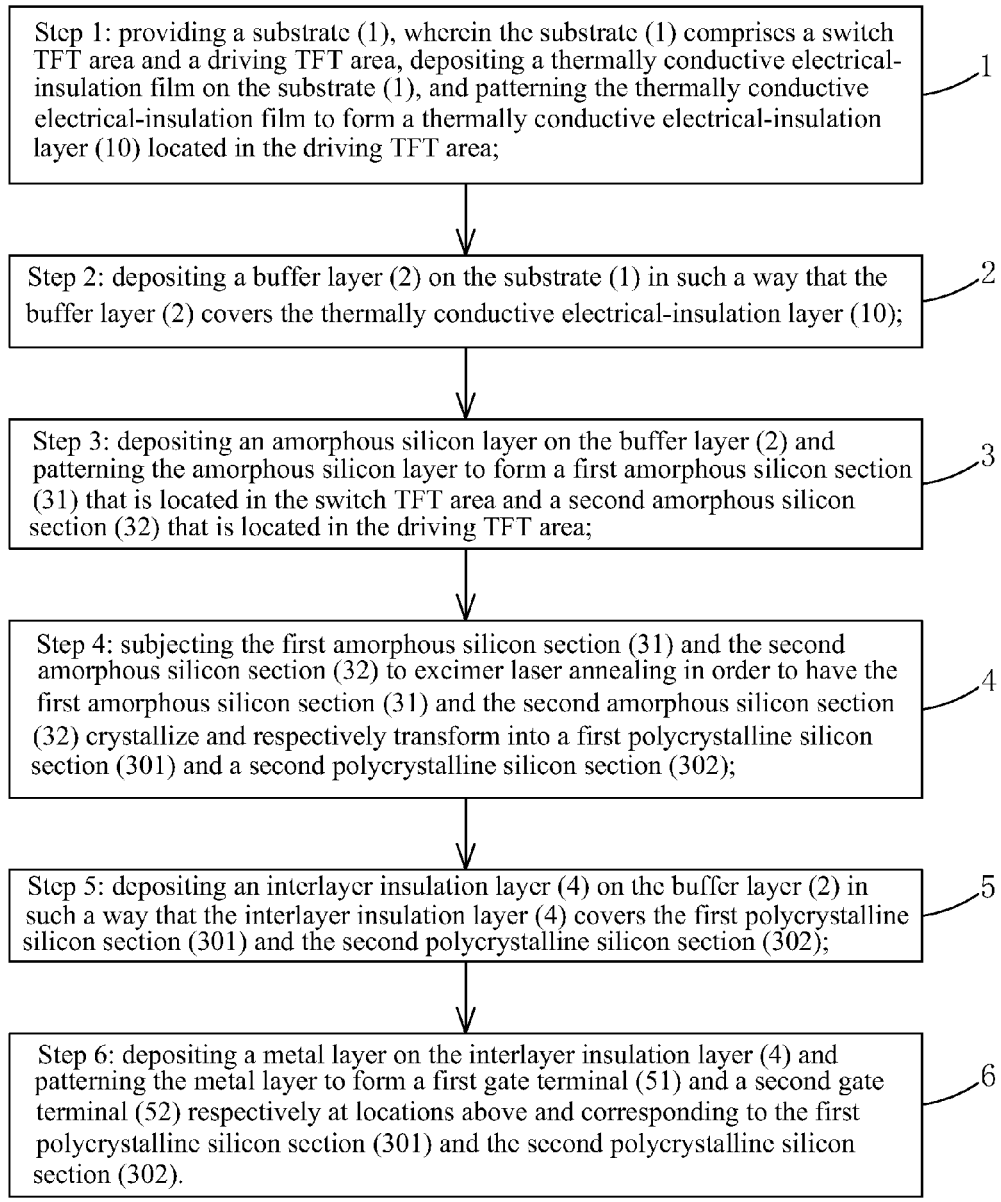
FIG. 1 is a flow chart illustrating a method for manufacturing a low-temperature polycrystalline silicon (LTPS) thin-film transistor (TFT) substrate structure according to the present invention.
Figure 2:
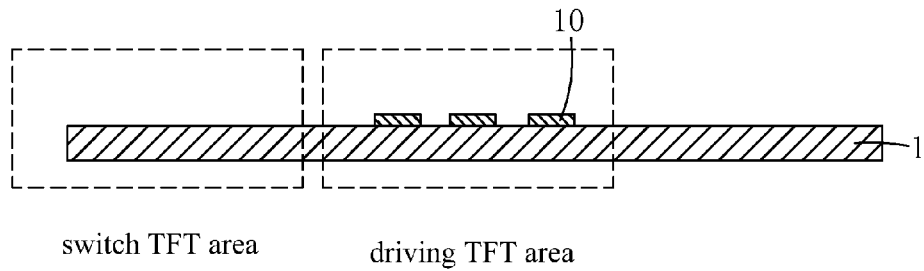
FIG. 2 is a schematic view illustrating a first step of the method for manufacturing the LTPS TFT substrate structure according to the present invention.

Referring to FIG. 1, firstly, the present invention provides a method for manufacturing a low-temperature polycrystalline silicon (LTPS) thin-film transistor (TFT) substrate structure, which comprises the following steps:

Step 1: as shown in FIG. 2, providing a substrate 1, wherein the substrate 1 comprises a switch TFT area and a driving TFT area, depositing a thermally conductive electrical-insulation film on the substrate 1, and patterning the thermally conductive electrical-insulation film to form a thermally conductive electrical-insulation layer 10 located in the driving TFT area.

Specifically, the substrate 1 can be a glass substrate or a silicon substrate.

Specifically, the thermally conductive electrical-insulation layer 10 is formed of a material of magnesium oxide or aluminum oxide.

Specifically, one masking operation is applied to pattern the thermally conductive electrical-insulation film in order to obtain the thermally conductive electrical-insulation layer 10 that is located in the driving TFT area and comprises patterns of circles or rectangles that are uniformly distributed and have the same size.

Figure 3:
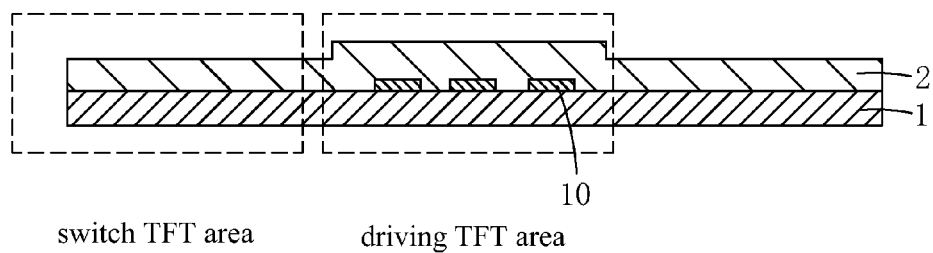
FIG. 3 is a schematic view illustrating a second step of the method for manufacturing the LTPS TFT substrate structure according to the present invention.

Step 2: as shown in FIG. 3, depositing a buffer layer 2 on the substrate 1 in such a way that the buffer layer 2 covers the thermally conductive electrical-insulation layer 10.

Specifically, chemical vapor deposition (CVD) is applied to form the buffer layer 2.

Specifically, the buffer layer 2 is formed of a material of silicon oxide, silicon nitride, or a combination thereof.

Figure 4:
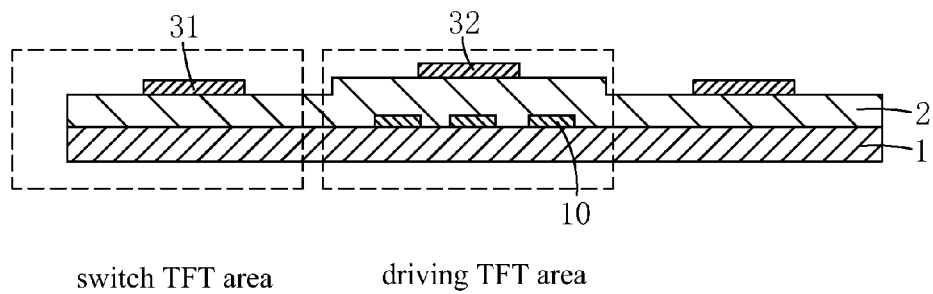
FIG. 4 is a schematic view illustrating a third step of the method for manufacturing the LTPS TFT substrate structure according to the present invention.

Step 3: as shown in FIG. 4, depositing an amorphous silicon layer on the buffer layer 2 and patterning the amorphous silicon layer to form a first amorphous silicon section 31 that is located in the switch TFT area and a second amorphous silicon section 32 that is located in the driving TFT area.

Specifically, vapor deposition is applied to form the amorphous silicon layer.

Figure 5:
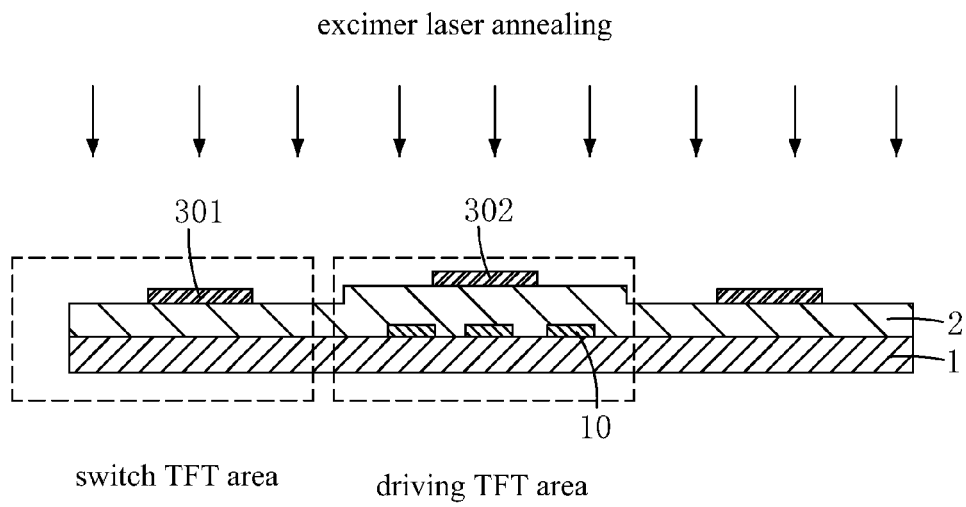
FIG. 5 is a schematic view illustrating a fourth step of the method for manufacturing the LTPS TFT substrate structure according to the present invention.

Step 4: as shown in FIG. 5, subjecting the first amorphous silicon section 31 and the second amorphous silicon section 32 to excimer laser annealing (ELA) in order to have the first amorphous silicon section 31 and the second amorphous silicon section 32 crystallize and respectively transform into a first polycrystalline silicon section 301 and a second polycrystalline silicon section 302.

During the ELA process, the thermally conductive electrical-insulation layer 10 absorbs heat so as to speed up the cooling rate of the amorphous silicon to form nuclei of crystallization, which grow up during the annealing process. Since the thermally conductive electrical-insulation layer 10 comprises regular patterns that are of the same size, the crystal grains of the second polycrystalline silicon section 302 in the driving TFT area have improved consistency and the size of the crystal grains is relatively large.

Specifically, a furnace tube, ELA equipment, or a CVD heating chamber is used to subject the first amorphous silicon section 31 and the second amorphous silicon section 32 to ELA.

Figure 6:
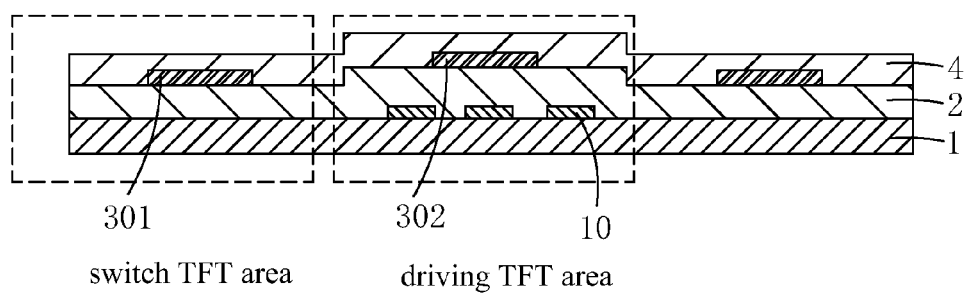
FIG. 6 is a schematic view illustrating a fifth step of the method for manufacturing the LTPS TFT substrate structure according to the present invention.

Step 5: as shown in FIG. 6, depositing an interlayer insulation layer 4 on the buffer layer 2 in such a way that the interlayer insulation layer 4 covers the first polycrystalline silicon section 301 and the second polycrystalline silicon section 302.

Figure 7:
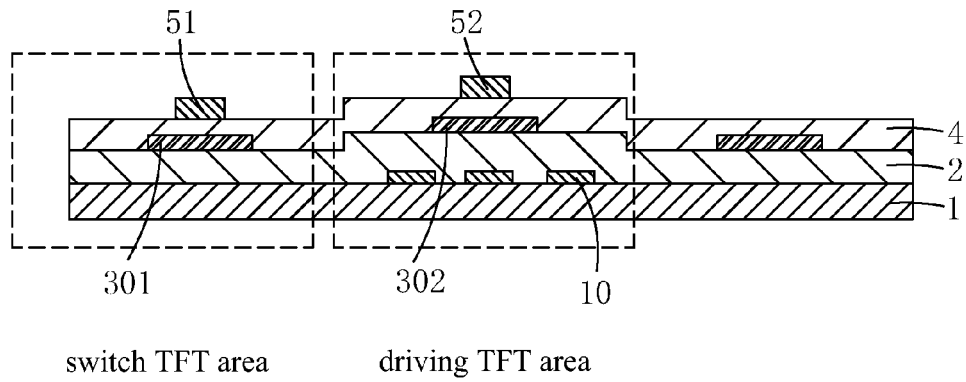
FIG. 7 is a schematic view illustrating a sixth step of the method for manufacturing the LTPS TFT substrate structure according to the present invention and is also a schematic cross-sectional view of the LTPS TFT substrate structure according to the present invention.

Step 6: as shown in FIG. 7, depositing a metal layer on the interlayer insulation layer 4 and patterning the metal layer to form a first gate terminal 51 and a second gate terminal 52 respectively at locations above and corresponding to the first polycrystalline silicon section 301 and the second polycrystalline silicon section 302, followed by making of source/drain terminals by means of known techniques.

In the above-described method for manufacturing an LTPS TFT substrate structure, patterns of a thermally conductive electrical-insulation layer that are of the same size are regularly distributed under a buffer layer of a driving TFT area so that in a subsequent crystallization process of an amorphous silicon layer resulting from ELA treatment, the thermally conductive electrical-insulation layer would absorb heat to speed up the cooling rate of the amorphous silicon to form crystal nuclei that gradually grow up during the annealing process. Since the thermally conductive electrical-insulation layer is made up of regularly distributed and size-consistent patterns, crystal grains of a polycrystalline silicon layer located in the driving TFT area show improved consistency and homogeneity and the grain sizes are relatively large to ensure the consistency of electrical property of the driving TFT, enhancing stability of electrical property of the driving TFT and preventing the events of poor image quality.

Referring to FIG. 7, the present invention also provides an LTPS TFT substrate structure, which comprises a switch TFT area and a driving TFT area.

The switch TFT area comprises a substrate 1, a buffer layer 2 arranged on the substrate 1, a first polycrystalline silicon section 301 arranged on the buffer layer 2, an interlayer insulation layer 4 arranged on the buffer layer 2 and covering the first polycrystalline silicon section 301, and a first gate terminal 51 arranged on the interlayer insulation layer 4 and located above and corresponding to the first polycrystalline silicon section 301.

The driving TFT area comprises a substrate 1, a thermally conductive electrical-insulation layer 10 arranged on the substrate 1, a buffer layer 2 arranged on the substrate 1 and covering the thermally conductive electrical-insulation layer 10, a second polycrystalline silicon section 302 arranged on the buffer layer 2, an interlayer insulation layer 4 arranged on the buffer layer 2 and covering the second polycrystalline silicon section 302, and a second gate terminal 52 arranged on the interlayer insulation layer 4 and located above and corresponding to the second polycrystalline silicon section 302.

Specifically, the substrate 1 can be a glass substrate or a silicon substrate.

Specifically, the thermally conductive electrical-insulation layer 10 is formed of a material of magnesium oxide or aluminum oxide.

Specifically, the patterns that make up the thermally conductive electrical-insulation layer 10 are circles, rectangles, or other shapes that are uniformly distributed and are of the same size.

Specifically, the buffer layer 2 is formed of a material of silicon oxide, silicon nitride, or a combination thereof.

In the above-described LTPS TFT substrate structure, patterns of a thermally conductive electrical-insulation layer that are regularly distributed and have the same size are arranged under a buffer layer of a driving TFT area, so that crystal grains of a polycrystalline silicon layer located in the driving TFT area show improved consistency and homogeneity and the grain sizes are relatively large and thus, the electrical property of the driving TFT is consistent and electrical stability is improved.

In summary, the present invention provides a method for manufacturing an LTPS TFT substrate structure, wherein patterns of a thermally conductive electrical-insulation layer that are of the same size are regularly distributed under a buffer layer of a driving TFT area so that in a subsequent crystallization process of an amorphous silicon layer resulting from ELA treatment, the thermally conductive electrical-insulation layer would absorb heat to speed up the cooling rate of the amorphous silicon to form crystal nuclei that gradually grow up during the annealing process. Since the thermally conductive electrical-insulation layer is made up of regularly distributed and size-consistent patterns, crystal grains of a polycrystalline silicon layer located in the driving TFT area show improved consistency and homogeneity and the grain sizes are relatively large to ensure the consistency of electrical property of the driving TFT, enhancing stability of electrical property of the driving TFT and preventing the events of poor image quality. The present invention provides an LTPS TFT substrate structure, wherein patterns of a thermally conductive electrical-insulation layer that are regularly distributed and have the same size are arranged under a buffer layer of a driving TFT area, so that crystal grains of a polycrystalline silicon layer located in the driving TFT area show improved consistency and homogeneity and the grain sizes are relatively large and thus, the electrical property of the driving TFT is consistent and electrical stability is improved.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a low-temperature polycrystalline silicon (LTPS) thin-film transistor (TFT) substrate structure, comprising the following steps:
    (1) providing a substrate, wherein the substrate comprises a switch TFT area and a driving TFT area, depositing a thermally conductive electrical-insulation film on the substrate, and patterning the thermally conductive electrical-insulation film to form a thermally conductive electrical-insulation layer located in the driving TFT area;
    (2) depositing a buffer layer on the substrate in such a way that the buffer layer covers the thermally conductive electrical-insulation layer;
    (3) depositing an amorphous silicon layer on the buffer layer and patterning the amorphous silicon layer to form a first amorphous silicon section that is located in the switch TFT area and a second amorphous silicon section that is located in the driving TFT area;
    (4) subjecting the first amorphous silicon section and the second amorphous silicon section to excimer laser annealing (ELA) in order to have the first amorphous silicon section and the second amorphous silicon section crystallize and respectively transform into a first polycrystalline silicon section and a second polycrystalline silicon section;
    (5) depositing an interlayer insulation layer on the buffer layer in such a way that the interlayer insulation layer covers the first polycrystalline silicon section and the second polycrystalline silicon section; and
    (6) depositing a metal layer on the interlayer insulation layer and patterning the metal layer to form a first gate terminal and a second gate terminal respectively at locations above and corresponding to the first polycrystalline silicon section and the second polycrystalline silicon section;
    wherein the thermally conductive electrical-insulation layer is formed of a material of magnesium oxide or aluminum oxide.

2. The method for manufacturing the LTPS TFT substrate structure as claimed in claim 1, wherein the substrate comprises a glass substrate or a silicon substrate.

3. The method for manufacturing the LTPS TFT substrate structure as claimed in claim 1, wherein the thermally conductive electrical-insulation layer comprises patterns that are uniformly distributed circles or rectangles having the same size.

4. The method for manufacturing the LTPS TFT substrate structure as claimed in claim 1, wherein in step (2), chemical vapor deposition is applied to form the buffer layer.

5. The method for manufacturing the LTPS TFT substrate structure as claimed in claim 1, wherein the buffer layer is formed of a material of silicon oxide, silicon nitride, or a combination thereof.

6. The method for manufacturing the LTPS TFT substrate structure as claimed in claim 1, wherein in step (3), vapor deposition is applied to form the amorphous silicon layer.

7. A method for manufacturing a low-temperature polycrystalline silicon (LTPS) thin-film transistor (TFT) substrate structure, comprising the following steps:
    (1) providing a substrate, wherein the substrate comprises a switch TFT area and a driving TFT area, depositing a thermally conductive electrical-insulation film on the substrate, and patterning the thermally conductive electrical-insulation film to form a thermally conductive electrical-insulation layer located in the driving TFT area;
    (2) depositing a buffer layer on the substrate in such a way that the buffer layer covers the thermally conductive electrical-insulation layer;
    (3) depositing an amorphous silicon layer on the buffer layer and patterning the amorphous silicon layer to form a first amorphous silicon section that is located in the switch TFT area and a second amorphous silicon section that is located in the driving TFT area;
    (4) subjecting the first amorphous silicon section and the second amorphous silicon section to excimer laser annealing (ELA) in order to have the first amorphous silicon section and the second amorphous silicon section crystallize and respectively transform into a first polycrystalline silicon section and a second polycrystalline silicon section;
    (5) depositing an interlayer insulation layer on the buffer layer in such a way that the interlayer insulation layer covers the first polycrystalline silicon section and the second polycrystalline silicon section; and
    (6) depositing a metal layer on the interlayer insulation layer and patterning the metal layer to form a first gate terminal and a second gate terminal respectively at locations above and corresponding to the first polycrystalline silicon section and the second polycrystalline silicon section;
    wherein the substrate comprises a glass substrate or a silicon substrate;
    wherein the thermally conductive electrical-insulation layer is formed of a material of magnesium oxide or aluminum oxide; and
    wherein the thermally conductive electrical-insulation layer comprises patterns that are uniformly distributed circles or rectangles having the same size.

8. The method for manufacturing the LTPS TFT substrate structure as claimed in claim 7, wherein in step (2), chemical vapor deposition is applied to form the buffer layer.

9. The method for manufacturing the LTPS TFT substrate structure as claimed in claim 7, wherein the buffer layer is formed of a material of silicon oxide, silicon nitride, or a combination thereof.

10. The method for manufacturing the LTPS TFT substrate structure as claimed in claim 7, wherein in step (3), vapor deposition is applied to form the amorphous silicon layer.

11. A low-temperature polycrystalline silicon (LTPS) thin-film transistor (TFT) substrate structure, which comprises a switch TFT area and a driving TFT area;
    the switch TFT area comprising a substrate, a buffer layer arranged on the substrate, a first polycrystalline silicon section arranged on the buffer layer, an interlayer insulation layer arranged on the buffer layer and covering the first polycrystalline silicon section, and a first gate terminal arranged on the interlayer insulation layer and located above and corresponding to the first polycrystalline silicon section; and the driving TFT area comprising a substrate, a thermally conductive electrical-insulation layer arranged on the substrate, a buffer layer arranged on the substrate and covering the thermally conductive electrical-insulation layer, a second polycrystalline silicon section arranged on the buffer layer, an interlayer insulation layer arranged on the buffer layer and covering the second polycrystalline silicon section, and a second gate terminal arranged on the interlayer insulation layer and located above and corresponding to the second polycrystalline silicon section;

wherein the substrate comprises a glass substrate or a silicon substrate; the thermally conductive electrical-insulation layer is formed of a material of magnesium oxide or aluminum oxide; the thermally conductive electrical-insulation layer comprises patterns that are uniformly distributed circles or rectangles; and the buffer layer is formed of a material of silicon oxide, silicon nitride, or a combination thereof.

* * * * *